(12) United States Patent
Carnahan (10) Patent No.: US 7,752,997 B1
(45) Date of Patent: Jul. 13, 2010

(54) APPARATUS AND METHOD FOR NANOSCALE PATTERN GENERATION

(75) Inventor: David L. Carnahan, Needham, MA (US)

(73) Assignee: NanoLab, Inc., Newton, MA (US)

( * ) Notice: Subject to any disclaimer, the term of this patent is extended or adjusted under 35 U.S.C. 154(b) by 636 days.

(21) Appl. No.: 11/354,341

(22) Filed: Feb. 14, 2006

Related U.S. Application Data

(63) Continuation of application No. 10/623,678, filed on Jul. 21, 2003, now Pat. No. 7,018,944.

(60) Provisional application No. 60/397,426, filed on Jul. 19, 2002.

(51) Int. Cl.
*B05C 3/00* (2006.01)
(52) U.S. Cl. .................... 118/421; 118/692
(58) Field of Classification Search ............. 118/421, 118/423, 666, 667, 692, 402; 425/135, 145, 425/174, 174.4, 174.6, 174.2; 264/401, 40.1, 264/40.7, 308
See application file for complete search history.

(56) References Cited

U.S. PATENT DOCUMENTS

| | | | |
|---|---|---|---|
| 5,143,663 A * | 9/1992 | Leyden et al. ............... 264/401 |
| 6,261,469 B1 | 7/2001 | Zakhidov et al. |
| 6,372,173 B1 * | 4/2002 | Peschges .................... 264/401 |
| 6,432,607 B1 * | 8/2002 | Tamura et al. ............. 430/269 |
| 6,518,194 B2 | 2/2003 | Winningham et al. |
| 6,706,402 B2 | 3/2004 | Rueckes et al. |
| 6,764,874 B1 | 7/2004 | Zhang et al. |

OTHER PUBLICATIONS

Dimitrov et al., Continuous Convective Assembling of Fine Particles into Two-Dimensional Arrays on Solid Surfaces, Langmuir, 1996, 1303-1311, 12.
Micheletto et al., A Simple Method for the Production of a Two-Dimensional, Ordered Array of Small Latex Particles, Langmuir, 1995, 3333-3336, 11.
Fischer et al., Submicroscopic Pattern Replication with Visible Light, J. Vac. Sci. Technol., Nov./Dec. 1981, 881-885, 19 (4).
Ren et al., Synthesis of Large Arrays of Well-Aligned Carbon Nanotubes on Glass, Science, Nov. 6, 1998, 1105-1107, 282.
Kralchevsky et al., Capillary Forces between Colloidal Particles, Langmuir, 1994, 23-36, 10.

* cited by examiner

*Primary Examiner*—Brenda A Lamb
(74) *Attorney, Agent, or Firm*—Pandiscio & Pandiscio (57) ABSTRACT

A method and apparatus that produces highly ordered, nano-sized particle arrays on various substrates. These regular arrays may be used as masks to deposit and grow other nanoscale materials.

8 Claims, 5 Drawing Sheets

Spheres are arranged in nearly perfect crystal order.

FIG. 2

Electron beam evaporation of nickel onto the prepared substrate

FIG. 3

Deposition through the interstitial spaces
results in triangular shaped deposits on the surface

FIG. 4

After coating and removal
of the sphere mask,
an array of deposited
triangles is exposed.

FIG. 5A

After a thermal
anneal at 800C,
the particles become
more spherical.

FIG. 5B

Schematically represents the pattern generated by two monolayers offset by 30 degrees.

FIG. 6A

A Microscopy image of such an array fabricated with the disclosed method.

FIG. 6B

Schematically represents the pattern generated by two monolayers offset by 10 degrees.

FIG. 7A

A Microscopy image of such an array fabricated with the disclosed method.

A schematic representation of an array of spheres on a surface.

FIG. 8B

Represents a coating atop the spheres, which leaves deposits in the interstices between spheres.

FIG. 8C

Shows the effect of dissolution of the spheres, and the resulting freestanding mask with holes plus the substrate with its corresponding deposits.

APPARATUS AND METHOD FOR NANOSCALE PATTERN GENERATION

REFERENCE TO PENDING PRIOR PATENT APPLICATIONS

This patent application is a continuation of prior U.S. patent application Ser. No. 10/623,678, filed Jul. 21, 2003 now U.S. Pat. No. 7,918,944 by David L. Carnahan for APPARATUS AND METHOD FOR NANOSCALE PATTERN GENERATION which in turn claims the benefit of prior U.S. Provisional Patent Application Ser. No. 60/397,426, filed Jul. 19, 2002 by David L. Carnahan for APPARATUS AND METHOD FOR NANOSCALE PATTERN GENERATION.

FIELD OF THE INVENTION

This invention relates to an apparatus and method for the patterning of nanoscale periodic structures using self-assembly of particles. The present invention is also directed to the use of these patterned arrays of regular particles, and the interstices between these particles, as a mask for the deposition of materials. Further, the present invention is directed to the formation of patterned arrays with periodicity that extends without defects over large areas. Still further, this invention is directed to the use of these arrays as masks for the deposition of materials which are catalytic to the growth of carbon nanotubes by chemical vapor deposition methods.

BACKGROUND OF THE INVENTION

The trend of miniaturization of solid-state electronics is likely to continue. Therefore, the ability to create complex structures at the nanoscale level will rapidly become important to the electronics industry. Traditional lithographic methods are approaching theoretical limits, and will be unable to define truly nanoscale features. Therefore, an alternative technique to simultaneously produce many identical nanoscale structures would be advantageous in terms of efficiency and cost.

Micron-sized electronic components and circuits are commonplace, and rapidly being replaced by circuitry with several hundred nanometer features. In order to make further advancements in this area, mass production techniques are needed for the assembly of 10-100 nanometer features.

Optical lithographic processes are limited in final resolution by the wavelength of the light used to expose the photoresist. Alternative techniques, such as electron beam lithography, have been developed to overcome the limitations of optical light. However, electron beam lithography is difficult to employ in a massively parallel system and, therefore, is costly.

A number of inventive approaches have been proposed to enable the production of nanoscale features on various substrates. Nanosphere lithography (NSL) is one such approach which holds promise, if certain hurdles can be overcome. In NSL, an array of ordered, nanosized particles are deposited on a substrate, forming a mask that exposes the substrate at sites between the particles. A material can then be deposited through the mask, creating a periodic structure, as proposed by U.S. Pat. No. 6,261,469, issued to Zakhidov et al.

To prepare an ordered array, particles are first dispersed in a liquid, then applied to a substrate, where the particles randomly assemble into a disordered mono or multilayer. As the liquid dries, capillary forces act upon the particles to form close packed, hexagonal arrays. Kralchevsky & Nagayama (Langmuir, Vol. 10, No. 1, 1994) studied the theoretical aspects of this method of fabrication, understanding that when the liquid film thickness approaches that of the particle size, the particles are pulled together by surface tension. The formation of an ordered monolayer was first reported by Fischer and Zingsheim in 1981, where they prepared a suspension of 312 nm particles on a glass plate (U. Fischer, H. Zingsheim, J. Vac. Sci. Technol., Vol. 19, pp. 881, 1981). After evaporation of the solvent, small portions of the plate were covered by a monolayer of spherical particles. In some areas, the spheres were close packed. Subsequent vacuum deposition through the interstices between particles in the close packed section resulted in a hexagonal pattern of triangularly shaped deposits on the substrate. The interstitial size is approximately 0.155 D, and the distance between adjacent deposits is approximately 0.8 D, where D is the diameter of the sphere.

Later, R. Micheletto (Langmuir, Vol. 11, pp. 3333, 1995) introduced a method to nucleate the hexagonal structure by tilting the substrate, which causes the organization to begin at the top of the substrate and continue downward as the drying and consolidation progresses. Dimitrov & Nagayama (Langmuir, Vol. 12, pp. 1303, 1996) modified this technique to slowly draw a plate from a bath of dispersed particles, resulting in the same effect.

However, the deficiency in all of the existing prior art is that these techniques do not form arrays with long range order. This is due to the existence of multiple nucleation sites, where the ordered arrays begin to form. When nucleation sites grow together, they must rotate or rearrange themselves if they are to mesh perfectly together, which does not happen in the techniques used in the prior art.

SUMMARY OF THE INVENTION

Accordingly, an object of the present invention is to provide apparatus for the synthesis of long range ordered arrays of particles on a substrate.

Another object of the present invention is to provide a method for synthesis of long range ordered arrays of particles on a substrate.

A further object of the invention is to provide a method for creating a deposition having a nanoscale pattern on a substrate.

With the above and other objects in view, as will hereinafter appear, there is provided apparatus for generating a mask having a nanoscale pattern, the apparatus comprising: a container having a top portion and a bottom portion, at least one sidewall between the top portion and the bottom portion, and an enclosed area formed by the top portion, the bottom portion and the at least one sidewall; a supporting liquid disposed within the container, the supporting liquid forming a top surface at a first given height between the bottom portion and top portion of the container, and the supporting liquid having a first given density; a substrate positionable within the container at a second given height from the bottom portion thereof, the substrate having a top surface disposed toward the top portion of the container; a suspension comprising a suspension fluid having a plurality of particles suspended therein, the suspension being selectively deliverable to the enclosed area within the container, the suspension of the plurality of particles having a second given density, the second given density of the suspension configured to be less than the first given density of the supporting liquid; and adjustment means for adjusting at least one of the first given height of the top surface of the supporting liquid and the second given height of the top surface of the substrate relative to one another so as to transfer the plurality of particles within the suspension from a first position to a second position, wherein the first given height of the top surface of the supporting liquid is higher than the second given height of the top surface of the substrate at the first position and the first given height of the top surface of the fluid is lower than the second given height of the top surface of the substrate at the second position so as to deposit the plurality of particles onto the top surface of the substrate and generate a nanoscale pattern thereon.

In accordance with a further feature of the invention, there is provided a method for generating a mask having a nanoscale pattern, the method comprising: suspending a periodic arrangement of objects on a top surface of a supporting liquid at a first given height above a top surface of a substrate; and adjusting at least one from a group consisting of the top surface of the supporting liquid and the top surface of the substrate to position the top surface of the fluid below the top surface of the substrate so as to deposit the periodic arrangement of objects onto the top surface of the substrate from the suspension on the top surface of the supporting liquid; wherein the periodic arrangement of objects is maintained over a given area.

In accordance with a further feature of the invention, there is provided a method for creating a deposition having a nanoscale pattern on a substrate, the method comprising: suspending a periodic arrangement of objects on a top surface of a supporting liquid at a first given height above a top surface of a substrate; adjusting at least one from a group consisting of the top surface of the fluid and the top surface of the substrate to position the top surface of the supporting liquid below the top surface of the substrate so as to deposit the periodic arrangement of objects onto the top surface of the substrate from the suspension of the top surface of the fluid, whereby to create a mask; and depositing a material through interstices contained in the mask so as to create a pattern on the substrate.

The above and other features of the invention, including various novel details of construction and combinations of parts and method steps, will now be more particularly described with reference to the accompanying drawings and pointed out in the claims. It will be understood that the particular devices and method steps embodying the invention are shown by way of illustration only and not as limitations of the invention. The principles and features of this invention may be employed in various and numerous embodiments without departing from the scope of the invention.

BRIEF DESCRIPTION OF THE DRAWINGS

These and other objects and features of the present invention will be more fully disclosed or rendered obvious by the following detailed description of the preferred embodiments of the invention, which are to be considered together with the accompanying drawings wherein like numbers refer to like parts, and further wherein.

DETAILED DESCRIPTION OF THE PREFERRED EMBODIMENTS

This invention remedies various deficiencies in the prior art through the creation of an array with long range order by floating particles on a liquid surface. On the liquid surface, the particles may easily rearrange, and their organization into a monolayer can be promoted with a surfactant. This highly ordered monolayer can then be deposited on a substrate, either by draining the liquid from the container, such that the monolayer deposits on the container floor, or by lifting a substrate up from below the liquid surface, effectively scooping up the organized array from the liquid. Using these techniques, defect free arrays larger than one square centimeter have been prepared.

In addition, another deficiency in the prior art has been to control the orientation of the monolayer with respect to the substrate. It has also been impossible to control the orientation of successive layers atop the first monolayer. In a preferred embodiment of the present invention, a laser is provided to create diffraction effects that determine the orientation of a floating monolayer. Further, the process can be repeated with a second monolayer and, therefore, the orientation of one monolayer can be controlled with respect to a second monolayer. In this way, ordered multilayer structures can be produced.

It is known in the prior art to use the interstices between particles as a mask to deposit materials onto a substrate. Improvements in the long range order of the particle mask yield dramatic improvements in the utility of the well ordered periodic arrays produced using deposition or etching techniques. For example, long range order provides for optical effects to emerge that are not observed when the periodicity is poor. The strength of the masks formed by the present invention permits the masks to be lifted off the surface.

Additionally, metals such as nickel, iron and cobalt may be deposited in the interstices between particles. These metals are known to be catalytic to the growth of aligned carbon nanotubes, following the chemical vapor deposition (CVD) techniques of Ren et al. (Science, Vol. 282, pp. 1105, 1998). The combination of this improved masking technique and the CVD method allows production of periodic carbon nanotube structures. Such structures made from carbon nanotubes have important applications, including field emission (particularly for displays), transistors, antennae, sensors and actuators, ion storage materials, chromatographic separation materials, catalyst support materials, photonic materials for optical circuitry, nanoscale grasping devices, and other related applications.

Figure 1A:
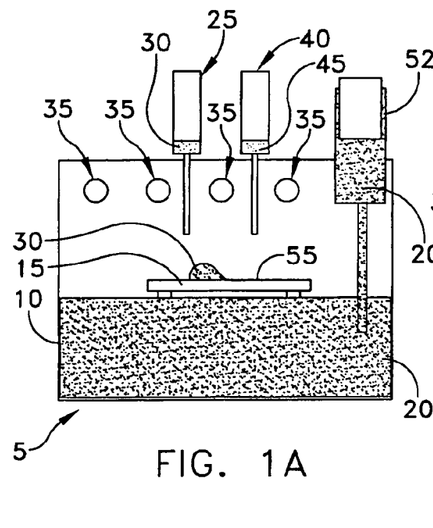
FIGS. 1A-1D are schematic views of apparatus for generating a mask having a nanoscale pattern.

In a preferred embodiment of the invention, and referring now to FIG. 1, there is shown an apparatus 5 for the ordering of a plurality of particles fitted within a container 10. Container 10 provides a draft free, clean environment for deposition onto a substrate 15 in accordance with the present invention. Container 10 is partially filled with a supporting liquid 20.

A pipette 25 is configured within container 10 to deliver a droplet 30 containing the plurality of particles onto substrate 15. Droplet 30 comprises a suspension comprising a suspension fluid having a plurality of spherical, similarly sized particles suspended therein. In a preferred embodiment of the present invention, the particles are each less than 10 microns in diameter. Droplet 30 is also sometimes referred to herein as a suspension of nanospheres.

Vents 35 within the sidewall of container 10 are opened or closed so as to control the vapor pressure within container 10, and thereby control the evaporation rate of nanosphere suspension 30 delivered within the container.

A second pipette 40 is configured within container 10 to deliver a surfactant 45 to a top surface 50 of the nanosphere suspension 30 contained in container 10.

Figure 1B:
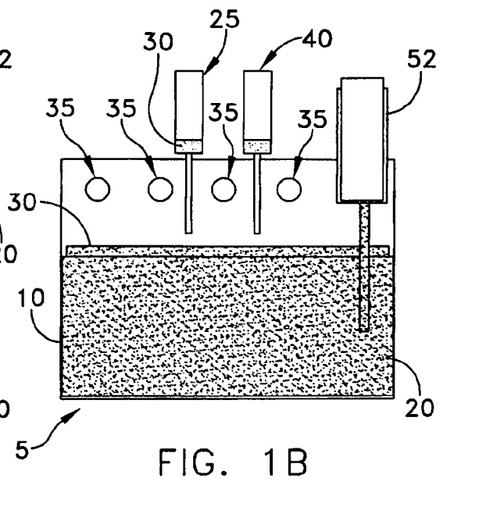

Referring now to FIG. 1B, there is shown a third pipette 52 configured to adjust the level of supporting liquid 20 within container 10. Third pipette 52 adds a quantity of fluid 20 to the container 10 so as to float the droplet 30 off a top surface 55 of substrate 15. The particles in nanosphere suspension 30 have a density which is lower than, or very close to, supporting liquid 20 such that nanosphere suspension 30 floats on supporting liquid 20. Additionally, in a preferred embodiment of the invention, the surface of the particles may be treated to be hydrophobic and, therefore, are not wet by the water. The floating particles form a monolayer but do not spontaneously orient with long-range order.

Figures 1C, 1D:
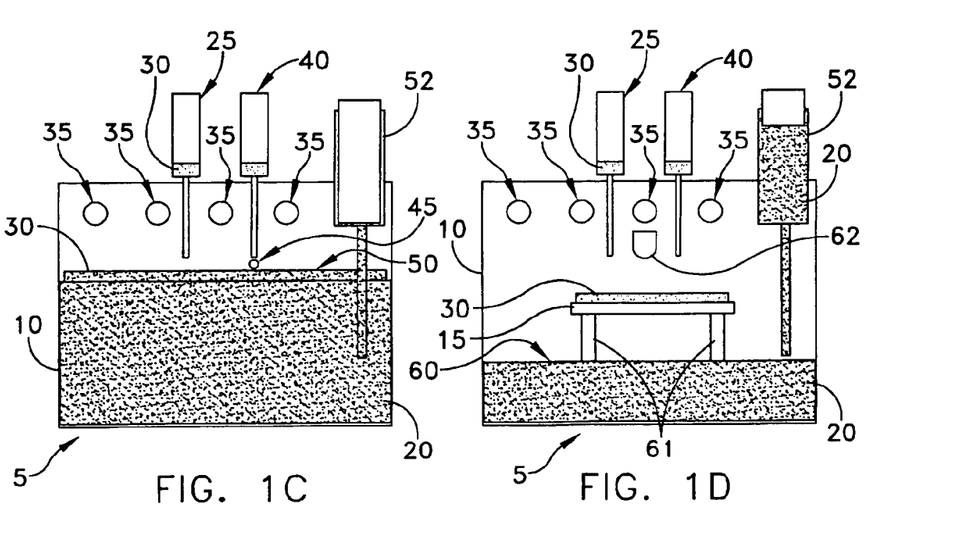

Referring now to FIG. 1C, in a preferred embodiment of the invention, a small quantity of surfactant 45 is added to consolidate the monolayer, which creates long-range order. Surfactant 45 acts to reduce the surface tension of the fluid of the nanosphere suspension 30, and increase adhesion between the particles therein, which in turn promotes the formation of a large, highly ordered monolayer.

Referring next to FIG. 1D, third pipette 52 is used to remove a quantity of supporting liquid 20 from container 10, thereby separating the ordered nanosphere suspension 30 from a surface 60 of supporting liquid 20 so as to leave the nanosphere suspension 30 deposited on the substrate 15, where it can dry. Vents 35 are adjusted to control the vapor pressure within container 10 and thereby control drying.

Thus, with the construction disclosed in FIGS. 1A-1D, a suspension of nanospheres 30 is deposited onto the top surface of a substrate 15, the suspension of nanospheres 30 is floated off the substrate, a surfactant 45 is introduced to promote the formation of a large, highly ordered monolayer, then the ordered nanosphere suspension 30 is deposited onto the top surface of the substrate, and then the suspension fluid is dried so as to deposit the ordered monolayer on the top surface of the substrate.

In an alternative embodiment of the present invention, a substrate 15 lies on a movable platform 61 below the surface of a supporting liquid 20 with higher density and substantially immiscible with the fluid of nanosphere suspension 30. The nanosphere suspension 30 floats on the high density supporting liquid 20. As the substrate is slowly raised up from the supporting liquid 20 into the suspension 30, and then into air, the solvent between the spheres evaporates, causing forces that act to arrange the spheres in an ordered fashion. By raising the substrate 15 up through the interfacial layer between the first liquid and the second, only a small amount of the nanosphere suspension 30 is required, as opposed to a sufficient volume to immerse the entire substrate.

In another preferred embodiment of the present invention, the frame 61 holding the substrate 15 is connected between two parallel electrodes, which provide a means for applying an electric field to the substrate. The application of an electric field to a droplet 30 on a substrate 15 alters the wetting angle of the droplet 30, and thereby controls the wetting of the substrate.

In another preferred embodiment of the present invention, the frame 61 holding the substrate 15 is a heating/cooling device so as to control the substrate temperature.

In another preferred embodiment of the present invention, the substrate frame 61 is a piezoelectric element, which can be electrically driven to apply a vibratory force to the substrate 15 so as to promote the oscillation of the particles and cause them to form into large, well ordered arrays.

In another preferred embodiment of the present invention, an inspection tool 62 is provided above the substrate 15 to determine the state of the array. In the case of larger particles, e.g., above 1 micron, an optical microscope is sufficient to inspect the state of the array formation. For smaller particles, optical techniques may be replaced with other inspection techniques well known to those skilled in the art.

In a further preferred embodiment of the present invention, the array formed by the spheres within the nanosphere suspension 30 are used as a mask to deposit materials on the substrate 15 through the intersticial spaces between adjacent spheres.

In a further preferred embodiment of the present invention, thermal annealing or chemical etching is used to change the morphology of the deposited material.

In a further preferred embodiment of the present invention, a metal, catalytic to the growth of carbon nanotubes, is deposited through the spheres of the mask.

EXAMPLES

Example 1

A silicon substrate was boiled in distilled, deionized water for 20 minutes to produce a hydrophillic surface. Next, the substrate was placed in a heated sample holder to allow thermal control over the substrate. A volume of fluid containing sufficient spheres to cover a 1 $cm^2$ area was drawn into a pipette. The polystyrene spheres in this example were supplied from Interfacial Dynamics Corporation, and were 500 nm in diameter, with sulphatized surfaces. They were shipped in an aqueous solution of 8.2 wt %. The suspension 30 in the pipette was deposited as a droplet on the hydrophilic silicon substrate. The droplet was then covered with a hydrophobic glass cover slide, causing the droplet to spread over a 1 $cm^2$ area of the substrate, thereby forming a monolayer. The glass slide served to limit evaporation of the suspension fluid. Evaporation progressed inwardly from the edge of the droplet, organizing the spheres into a highly ordered monolayer. By limiting the evaporation to occur on one edge only, the evaporation progressed as a front, organizing the monolayer as it went. After the suspension fluid had evaporated, the hydrophobic glass slide was lifted off the surface, revealing the ordered monolayer below.

Example 2

Monolayers were prepared using monodisperse polystyrene (PS) particles with diameters of 1040, 925, 496, 217 and 127 nm. All particles were purchased from Microparticles GmbH (Germany) as a 10 wt. % suspension. The PS particles have a density of 1.05 g/cm$^3$, a refractive index of 1.59, and a hydrophobic surface. The standard suspension 30 was diluted with an equal amount of ethanol. The suspension 30 was then ultrasonically agitated for 20-30 seconds in a bath to improve mixing. The spheres have a polydispersity index of less than 0.05.

Oriented (111) p-silicon wafers, boron doped, with resistivity of 1-20 Ωcm and thickness of 525±25 μm, were obtained from SilChem. The surface roughness parameter RA was about 2 nm. These wafers were cut into 10×10 mm or 5×5 mm squares. Each square was thoroughly cleaned with acetone, and additionally in ethanol, in ultrasonic bath for 1 minute. The substrates were dried in a nitrogen atmosphere.

Figure 2:
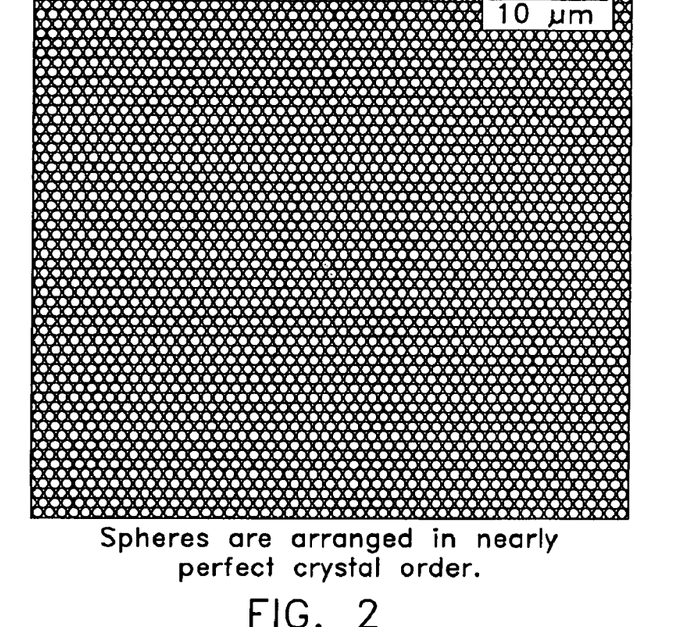
FIG. 2 is schematic view of an embodiment of spheres arranged in nearly perfect crystal order.

A solution of PS-latex particles was prepared using distilled and deionized water from Mili-Q systems. About 4-6 μl of the prepared solution was applied onto the surface of the clean silicon square (which was kept in 10% dodecylsodiumsulfate solution for 24 hours previously) using an Eppendorf pipette tip. The substrate was then slowly immersed in deionized water, causing the PS particles to float, forming an unordered monolayer on the top surface of the water. To consolidate the monolayer and increase the level of orientation, one droplet of 2% dodecylsodiumsulfate solution was added. This caused the particles to stick together, forming a large monolayer with a high degree of order. The substrate was then slowly pulled from water, taking the floating monolayer with it. The monolayer was allowed to dry, in a clean environment. The resulting monolayer is shown in FIG. 2.

Example 3

Figure 3:
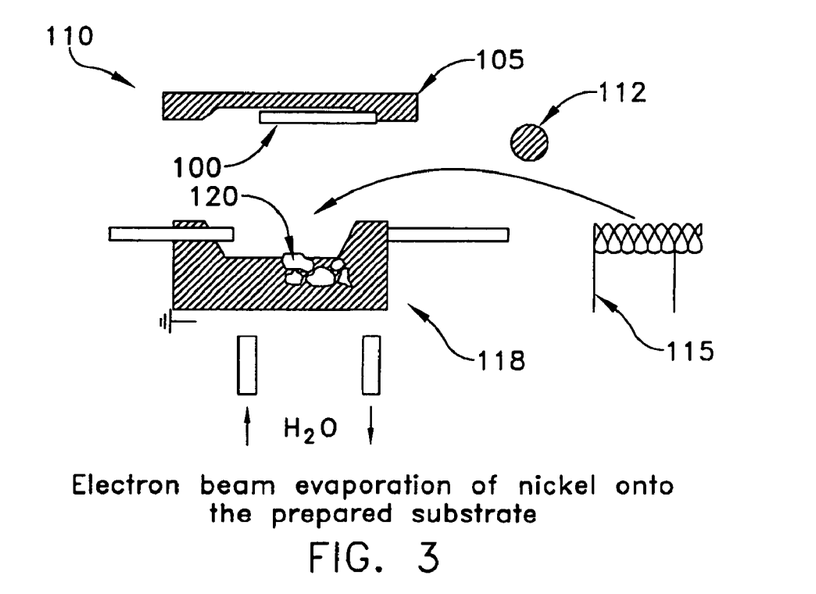
FIG. 3 is a schematic view of electron beam evaporation of nickel onto the prepared substrate.
Figure 4:
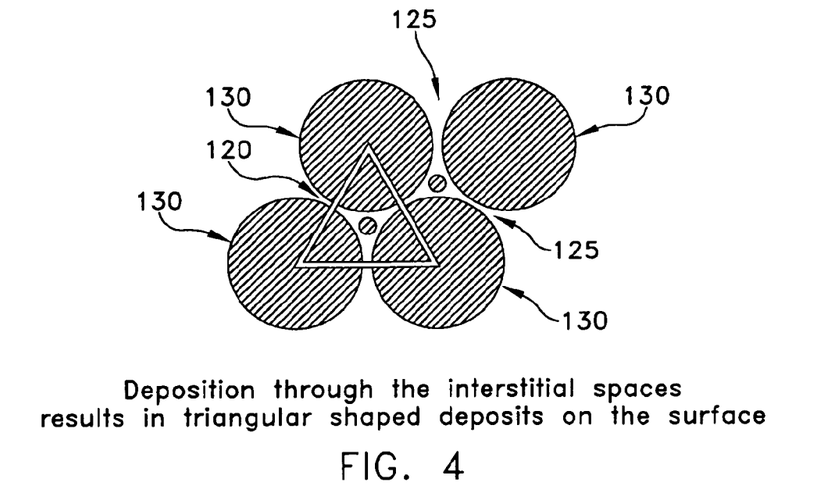
FIG. 4 is a schematic view of deposition of a material through the interstitial spaces of the mask which results in triangular shaped deposits on the surface thereof.
Figure 5A:
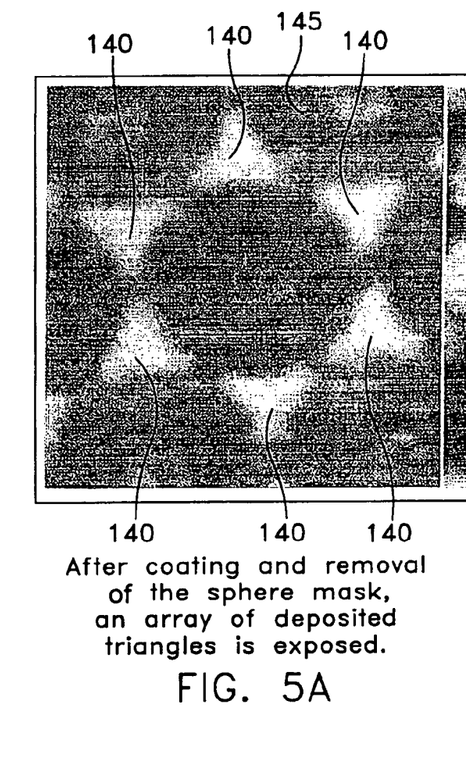
FIG. 5A is a schematic view of a portion of the deposited material after coating and removal of the sphere mask in which there is exposed an array of deposited triangles.
Figure 5B:
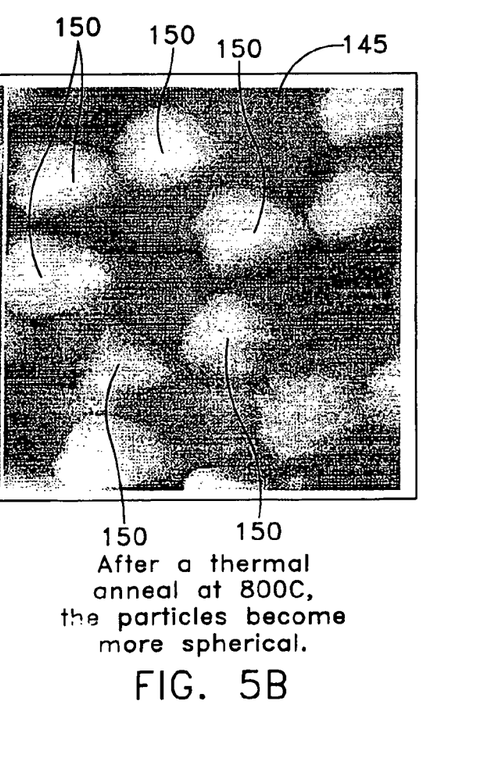
FIG. 5B is a schematic view of the portion of the deposited material after thermal annealing at 800 degrees C. in which the particles become more spherical.

Looking next at FIG. 3, the samples 100 and 105, produced in Examples 1 and 2 above, were placed in an electron beam evaporator 110, and evacuated to 5×10–6 mbar. Using a 10 kV acceleration voltage, the electrons 112 produced by a tungsten filament 115 were directed into a crucible 118 holding nickel particles 120. Under these conditions, the nickel 120 is vaporized, and deposits upon surfaces in the chamber, including the samples 100 and 105. The evaporation rate was measured and found to be 1 nm/s under these conditions. With the PS coating, most of the nickel 120 does not reach the substrate surface 100 and 105. However, and looking now at FIG. 4, in the interstices 125 between particles 130, the nickel 120 sees the substrate 105, and is deposited thereon. The deposits form a hexagonal array of triangular shapes 140 between spheres 130. After dissolving spheres 130 in THF (tetrahydrofuran), the remaining pattern 140 on substrate 145 is revealed, as shown in FIG. 5A. After thermal annealing, the triangluar shaped particles 140 become rounded spherical structures 150, as shown in FIG. 5B.

Example 4

A floating monolayer, as created in Example 2, was illuminated with laser light, creating a diffraction pattern on the substrate below. The observed pattern indicates the orientation of the monolayer. The monolayer was deposited on the substrate and dried.

Figure 6A:
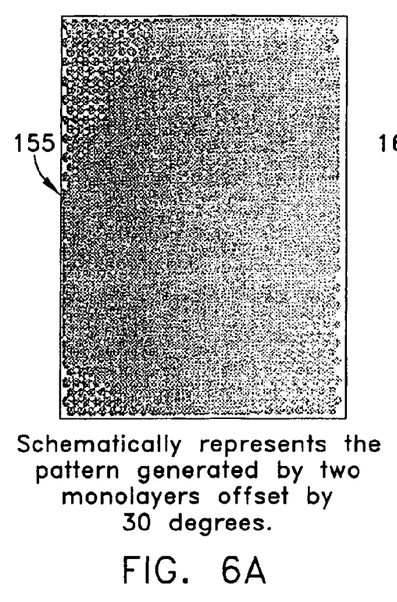
FIG. 6A is a schematic representation of the pattern generated by two monolayers offset by 30 degrees.
Figure 6B:
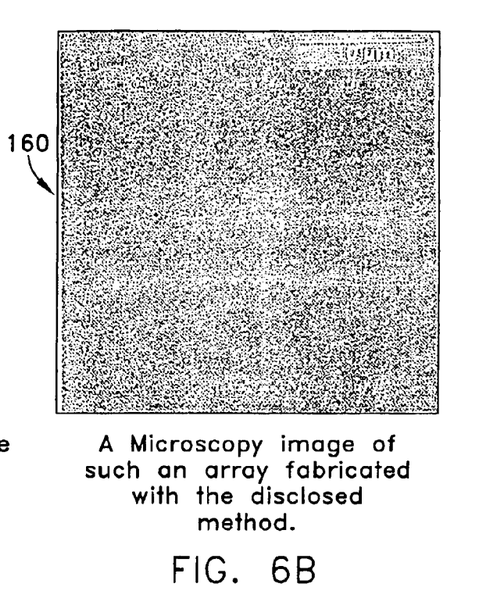
FIG. 6B is a schematic view of a microscopy image of the array of FIG. 6A fabricated with the disclosed method.
Figure 7A:
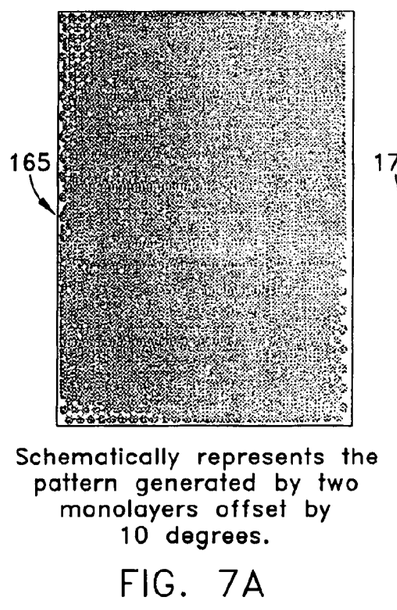
FIG. 7A is a schematic representation of the pattern generated by two monolayers offset by 10 degrees.
Figure 7B:
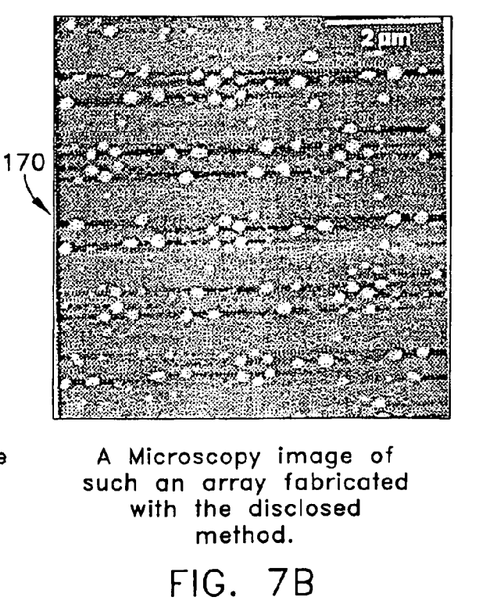
FIG. 7B is a schematic representation of a microscopy image of the array of FIG. 7A fabricated with the disclosed method.

After establishing a new floating monolayer, the orientation was checked again, and adjusted to specific rotation with respect to the first layer. FIGS. 6A, 6B, 7A and 7B show resulting multilayers 155, 160, 165, and 170, which have a complex pattern. The angle between each of the layers in FIGS. 6A and 6B is 30 degrees. The angle between each of the layers in FIGS. 7A and 7B is 10 degrees.

Example 5

Figure 8A:
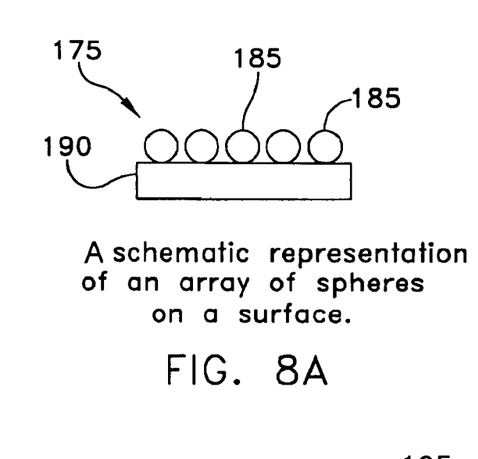
FIG. 8A is a schematic representation of an array of spheres on a surface.
Figure 8B:
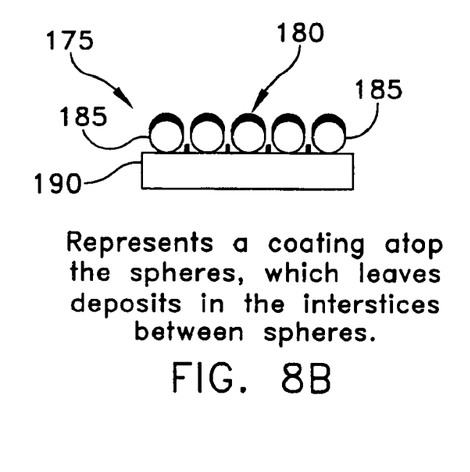
FIG. 8B represents a coating on top of the spheres of FIG. 8A, which leaves deposits in the interstices between spheres.
Figure 8C:
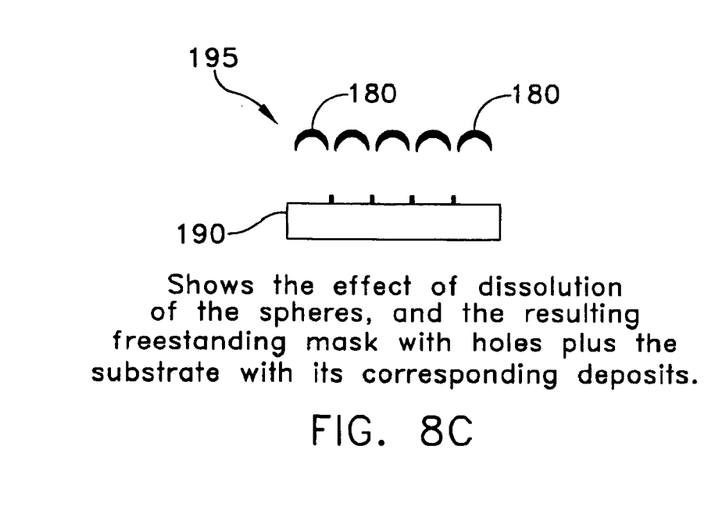
FIG. 8C is a schematic illustration of a freestanding mask with holes therein and the substrate with corresponding deposits produced after dissolution of the spheres shown in FIGS. 8A and 8B.

Referring now to FIGS. 8A-8C, there is shown a sample 175 prepared in a manner similar to Example 2, coated with metal 180 as described hereinabove (FIGS. 8A and 8B). The amount of metal deposited was sufficient to create a film thickness equivalent to half of the diameter of spheres 185. After deposition, spheres 185 were dissolved in THF (see FIG. 8C). The metal that had been deposited atop spheres 185 separates from substrate 190 upon dissolution of spheres 185 and creates a freestanding metal film, which has holes therethrough. This process creates a mask 195 that can be used by other processes.

What is claimed is:

1. Apparatus for generating a mask having a nanoscale pattern, the apparatus comprising:
   a container having a top portion and a bottom portion, at least one sidewall between the top portion and the bottom portion, and an enclosed area formed by the top portion, the bottom portion and the at least one sidewall;
   a supporting liquid disposed within the container, the supporting liquid forming a top surface at a first given height between the bottom portion and top portion of the container;
   a substrate positionable within the container at a second given height from the bottom portion thereof, the substrate having a top surface disposed toward the top portion of the container;
   a suspension comprising a suspension fluid having a plurality of particles suspended therein, the suspension being selectively deliverable to the enclosed area within the container;
   adjustment means for adjusting at least one of the first given height of the top surface of the supporting liquid and the second given height of the top surface of the substrate relative to one another so as to transfer the plurality of particles within the suspension from a first position to a second position, wherein the first given height of the top surface of the supporting liquid is higher than the second given height of the top surface of the substrate at the first position and the first given height of the top surface of the fluid is lower than the second given height of the top surface of the substrate at the second position so as to deposit the plurality of particles onto the top surface of the substrate and generate a nanoscale pattern thereon; and
   a vapor pressure controller for selectively controlling vapor pressure within the container so as to adjust the evaporation rate of the suspension fluid.

2. Apparatus according to claim 1 further comprising a surfactant applicator for selectively introducing a surfactant onto the top surface of the suspension so as to stimulate organization of a monolayer of the plurality of particles.

3. Apparatus according to claim 2 wherein the substrate is configured for selective vertical adjustment between the top portion and the bottom portion of the container so as to provide the adjustment means for adjusting the second given height of the top surface of the substrate relative to the first given height of the top surface of the supporting liquid so as to lift the monolayer of the plurality of particles off the top surface of the supporting liquid by raising the substrate out of the fluid.

4. Apparatus according to claim 1 further comprising an electric field applicator for selectively applying an electric field to the suspension so as to alter the wetting angle of the suspension so as to promote wetting of the substrate.

5. Apparatus according to claim 1 further comprising a mechanical vibratory force applicator for selectively applying a mechanical vibratory force to the substrate so as to form the plurality of particles into well ordered arrays.

6. Apparatus according to claim 1 further comprising a temperature controller for controlling the temperature of the suspension so as to control the evaporation rate of the suspension fluid.

7. Apparatus according to claim 1 further comprising a magnetic field applicator for applying a magnetic field to the fluid so as to form the plurality of particles into well ordered arrays.

8. Apparatus according to claim 1 further comprising a chemical applicator for applying chemicals to adjust interaction between particles of the plurality of particles.

* * * * *